United States Patent [19]

Minami et al.

[11] 4,032,838
[45] June 28, 1977

[54] DEVICE FOR GENERATING VARIABLE OUTPUT VOLTAGE

[75] Inventors: Shunji Minami, Moriguchi; Takehide Takemura; Shunzo Oka, both of Hirakata, all of Japan

[73] Assignee: Matsushita Electric Industrial Co., Ltd., Osaka, Japan

[22] Filed: Dec. 14, 1973

[21] Appl. No.: 424,905

[30] Foreign Application Priority Data

Dec. 30, 1972  Japan .......................... 47-128493
Dec. 20, 1972  Japan ...................... 47-147214[U]

[52] U.S. Cl. ................................. 323/19; 307/251; 323/22 R; 328/125
[51] Int. Cl.² ........................................... G05F 3/12
[58] Field of Search ............ 307/251, 304; 323/16, 323/19, 22 R; 328/125

[56] References Cited
UNITED STATES PATENTS

| 2,828,447 | 3/1958 | Mauchly | 328/125 X |
| 3,233,186 | 2/1966 | Theriault | 307/304 X |
| 3,373,295 | 3/1968 | Lambert | 307/304 X |
| 3,454,789 | 7/1969 | Tyler et al. | 307/304 X |
| 3,461,325 | 8/1969 | Barrett | 307/251 X |
| 3,463,993 | 8/1969 | Beck et al. | 307/304 X |
| 3,647,940 | 3/1972 | Harwood | 307/304 X |
| 3,728,556 | 4/1973 | Arnell | 307/304 X |

*Primary Examiner*—A. D. Pellinen
*Attorney, Agent, or Firm*—Burgess, Ryan and Wayne

[57] ABSTRACT

In a device of the type in which the output voltage derived from the source of a MOS field-effect transistor is varied in response to the voltage across a non-polarized capacitor connected to the gate of the field-effect transistor, positive and negative inputs are provided by two switching elements which are controlled in response to small DC signals. The device functions as a variable resistor, and is adapted to be remotely controlled.

12 Claims, 6 Drawing Figures

DEVICE FOR GENERATING VARIABLE OUTPUT VOLTAGE

BACKGROUND OF THE INVENTION

The present invention relates to a device for generating variable voltage of the type in which a voltage across a non-polarized capacitor inserted between the gate of a MOS field-effect transistor and the ground is controlled in response to a positive or negative input selectively switched by two switching elements which in turn are controlled in response to small DC control signals, so that the output voltage derived from the source of the field-effect transistor may be varied continuously.

In general, variable resistors are widely used in order to vary output voltages, but they have an objectionable feature in that noise is produced because the slider or armature slides over a resistor so as to vary the voltage. Furthermore they have another objectionable feature in that the output voltages are unstable because the characteristics of the resistors tend to change very easily in response to the environmental temperature.

SUMMARY OF THE INVENTION

One of the objects of the present invention is to provide a device for generating variable output voltage which eliminates the use of any conventional variable resistor but functions exactly as a variable resistor.

Another object of the present invention is to provide a device capable of varying its output voltage in response to small DC control signals.

A further object of the present invention is to provide a remote controlled device for generating variable output voltage specially adapted to be used with a television receiver so as to continuously vary the volume and the channel selector.

Briefly stated, according to the present invention, a non-polarized capacitor is inserted between the ground and the gate of a MOS field-effect transistor, and the gate is connected to two switching elements through an input resistor and a neon bulb. When a first small DC control signal is applied to the first switching element, the voltage across the non-polarized capacitor is increased, while when the second small DC voltage is applied to the second switching elements, the voltage across the capacitor drops. In response to the voltage across the capacitor, the output voltage derived from the source of the MOS field-effect transistor may be varied.

The devices for generating variable output voltage in accordance with the present invention, therefore, function as variable resistors, and may eliminate completely the sliding contact between an armature or brush and a resistor element in a variable resistor. Therefore, the problems of noise and aging may be overcome. Furthermore, since the switching elements are used, the output voltage may be continuously varied in response to small DC control signals, which may be directly applied to or transmitted to the switching elements. Therefore, the device for generating variable output voltage is best adapted to be used with a television receiver so as to vary its volume and other controlled perameters by a remote control system.

The above and other objects, features and advantages of the present invention will become more apparent from the following description of some preferred embodiments thereof taken in conjunction with the accompanying drawings.

Figure 1:
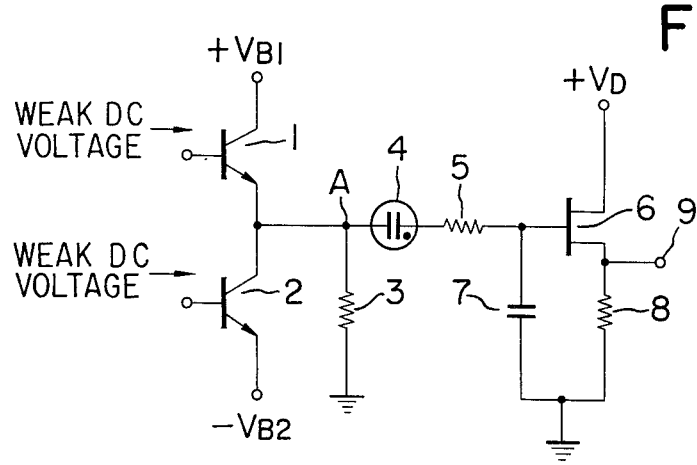
FIG. 1 is a simplified schematic diagram of a circuit for producing a variable output voltage, in accordance with one embodiment of the invention.

DESCRIPTION OF THE PREFERRED EMBODIMENTS:

Referring to FIG. 1, a switching transistor 1 has its emitter connected to the collector of a switching transistor 2. The collector of the switching transistor 1 is connected to a +DC voltage source $V_{B1}$, while the emitter of the transistor 2 is connected to a −DC voltage source $V_{B2}$. Between the junction between the emitter of the transistor 1 and the collector of the transistor 2 and the ground there is inserted a resistor 3 for providing a voltage drop. A neon bulb 4 has its one terminal connected to said junction and the other terminal connected to the gate of a MOS field-effect transistor 6 through a resistor 5. A non-polarized capacitor 7 has its one terminal connected to the gate of the field-effect transistor 6 and the other terminal grounded. An output resistor 8 is inserted between the source of the field-effect transistor 6 and the ground, and an output terminal 9 is connected to the source of the transistor 6. The drain of the transistor 6 is connected to a +DC voltage source $V_D$.

Next the mode of operation will be described. When there is no input signal applied to the bases of both transistors 1 and 2, they are off so that the potential at the junction A is zero. Therefore, the neon bulb 4 will not be conducting electrical current. When an input signal is applied to the base of the transistor 1, the latter is turned on so that the potential at the junction A rises. Therefore when the potential at junction A reaches the breakdown voltage of the neon bulb 4 conducts so that the capacitor 7 is charged. As a result, the output voltage rises. When the small DC input signal is also applied to the base of the transistor 2, the potential at the junction A rises above the firing voltage of the neon bulb 4 so that it conducts in the opposite direction. As a result the capacitor 7 is discharged so that the output voltage drops. Even when the input signals are interrupted, the capacitor 7 may hold some charge so that a constant output voltage whose magnitude is in proportion to the voltage across the capacitor 7 may be derived from the output terminal 9.

Figure 2:
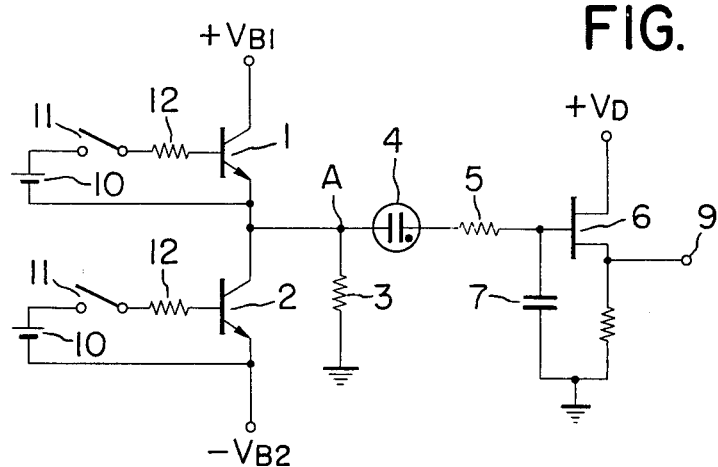
FIG. 2 is a simplified schematic diagram of a modification of the circuit of FIG. 1.

Referring to FIG. 2, a second embodiment is substantially similar in construction to the first embodiment shown in FIG. 2 except that the base of each of the transistors 1 and 2 is connected through a resistor 12 and a switch 11 to a DC power source 10 so that a DC input signal may be applied to the bases of the transistors 1 and 2.

Figure 3:
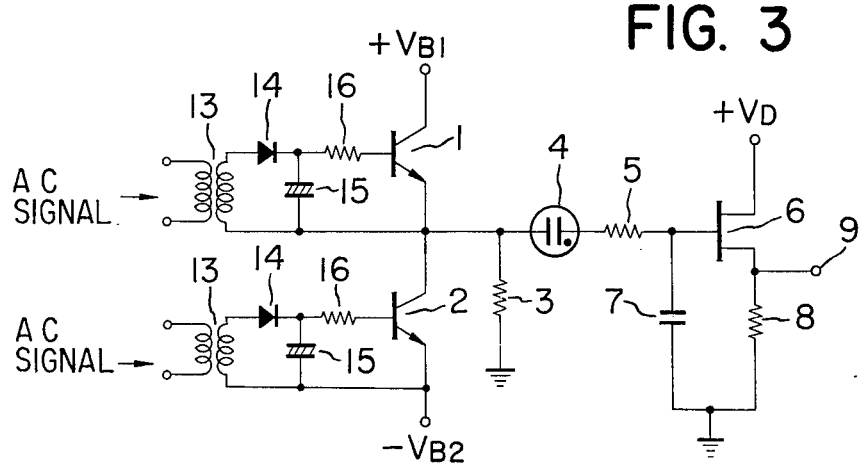
FIG. 3 is a simplified schematic diagram of a further modification of the circuit of FIG. 1.

A third embodiment shown in FIG. 3 is adapted to respond to the AC input signals transmitted through a remote control system. That is, the remote control AC input signals are rectified to be applied to the bases of the transistors 1 and 2 by a transformer 13, a rectifier element 14, a capacitor 15 and a resistor 16.

Figure 4:
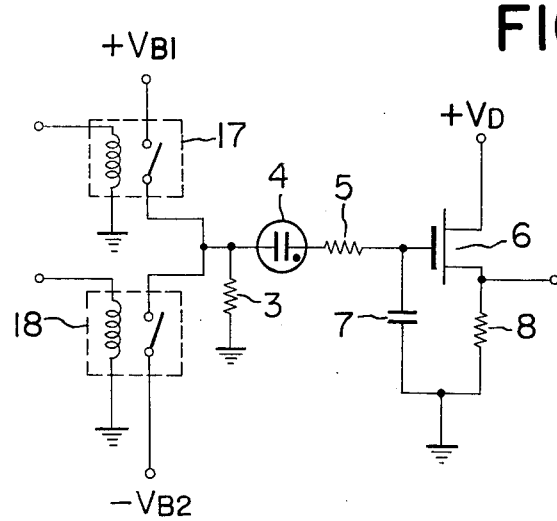
FIG. 4 is a simplified schematic diagram of a still further modification of the circuit of FIG. 1, wherein relays are substituted for the transistor switches of FIG. 1.

A fourth embodiment shown in FIG. 4 is also substantially similar in construction and function to those of the first, second and third embodiments described hereinbefore except that instead of the switching transistors 1 and 2, relays 17 and 18 are used.

Figure 5:
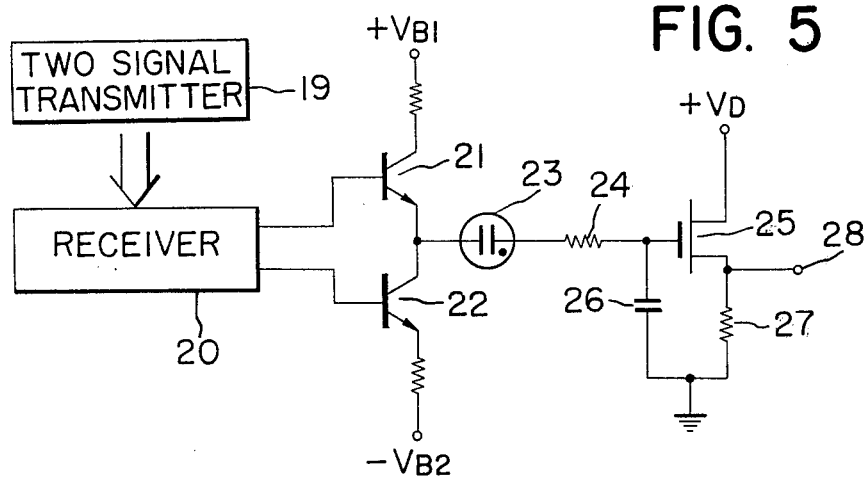
FIG. 5 is a simplified schematic diagram of still another modification of the circuit of FIG. 1 for use in a remote control system.

A fifth embodiment shown in FIG. 5 is adapted to be used in a remote control system. A transmitter 19 is adapted to transmit two different control signals which are received by a receiver 20 consisting of an amplifier, a tuning circuit, a rectifier and so on. The arrangement of two switching transistors 21 and 22, a neon bulb 23, a resistor 24, a MOS field-effect transistor 25, a capacitor 26, an output resistor 27 and an output terminal is substantially similar to that of the first embodiment. The outputs of the receiver 20 are applied to the bases of the switching transistors 21 and 22 in such a way that in response to a first output signal the switching transistor 21 conducts electrical current and in response to a second output signal the switching transistor 22 conducts electrical current.

Next the mode of operation will be described. When the receiver 20 provides the first output signal in response to the light, sound or radio control signals transmitted from the transmitter 19, the first switching transistor 21 conducts so that the emitter potential becomes substantially equal to the $+V_{B1}$ which is so selected as to be higher than the firing voltage of the neon bulb 23. The neon bulb 23 conducts so that the capacitor 26 is charged through the input resistor 24. Therefore, the drain current flowing through the field-effect transistor 25 is dependent upon the gate potential which is equal to the voltage across the capacitor 26. In summary, in response to the first signal from the receiver 20 the first switching transistor 21 conducts so that the capacitor 26 is continuously charged and the output voltage, which is the product of the drain current and the resistance of the output resistor 27, is continuously increased. Upon the termination of the control signal, the neon bulb 23 is cut off so that the voltage across the capacitor 26 remains at a constant level and the output voltage remains also at a constant level.

When the second switching transistor 22 conducts in response to the second signal, the collector potential instantaneously becomes equal to the $-V_{B2}$ which is so selected as to be higher than the firing voltage of the neon bulb 23. Therefore, the charges on the capacitor 26 are gradually discharged, and upon termination of the second signal, the voltage across the capacitor 26 remains at a constant level so that the output voltage also remains at a constant level. In summary, the charging and discharging of the capacitor 26 are controlled in response to the two signals so that the output voltage may be continuously varied from the zero to about $+V_D$ that is, over a range between the pinch-off and the saturation of the field-effect transistor 25.

Figure 6:
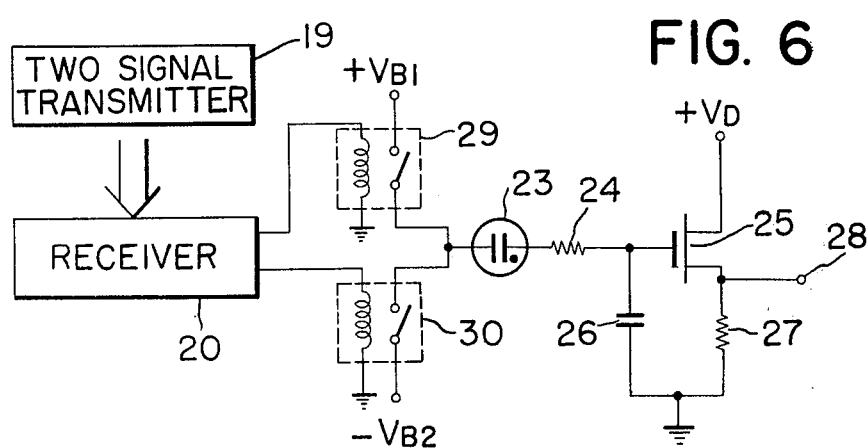
FIG. 6 is a simplified schematic diagram of a modification of the circuit of FIG. 5, incorporating relays in place of the switching transistors.

A sixth embodiment shown in FIG. 6 is substantially similar in construction and function to the fifth embodiment described hereinbefore with reference to FIG. 5 except that instead of the switching transistors 21 and 22, relays 29 and 30 are used.

What is claimed is:

1. A device for generating variable output voltage comprising
   a. a first switching element means having a first terminal for receiving a positive voltage, a second terminal for receiving a first input signal and a third terminal for providing a current out of said third terminal in response to the first input signal on the second terminal,
   b. a second switching element means having a first terminal for receiving a negative voltage, a second terminal for receiving a second input signal and a third terminal connected to said third terminal of said first switching element for conducting current into said third terminal in response to said second input signal,
   c. a neon bulb having a first terminal connected to the junction between said third terminals of said first and second switching element and having a second terminal for selectively conducting current in either of two directions in response to the currents from said third terminals of said first and second switching elements,
   d. a MOS field-effect transistor whose gate is connected through an input resistor to the second terminal of said neon bulb,
   e. a non-polarized capacitor inserted between the gate of said MOS field-effect transistor and the ground, and
   f. an output resistor inserted between the source of said MOS field-effect transistor and the ground,
   whereby a variable output voltage is derived across said output resistor.

2. A device for generating variable output voltage as defined in claim 1 wherein
   said first and second switching elements comprise two switching transistors.

3. A device for generating variable output voltage as defined in claim 1 wherein
   said first and second switching elements comprise two relays.

4. A device for generating variable output voltage as defined in claim 2 wherein
   a series-connected circuit consisting of a switch and a DC power source is inserted in the base circuit of each of said first and second switching transistors.

5. A device for generating variable output voltage as defined in claim 2 wherein
   a rectifier circuit adapted to convert an AC signal into a DC signal is inserted in the base circuit of each of said first and second switching transistors.

6. A device for generating variable output voltage as defined in claim 1 wherein
   a resistor for providing a voltage drop is inserted between the junction between said third terminals of said first and second switching elements and the ground.

7. A remote controlled device for generating variable output voltage comprising
   a. a transmitter adapted to transmit two different control signals,
   b. a receiver adapted to receive said two different control signals transmitted from said transmitter and generate a first and second output signals,
   c. a first switching element with a first terminal for receiving said first output signal of said receiver, a second terminal for receiving a positive voltage, and a third terminal for providing a current in response to said first output signal,
d. a second switching element with a first terminal for receiving said second output signal, a second terminal for receiving a negative voltage and a third terminal connected to said third terminal of said first switching element for providing a current in response to said second output signal,
e. a neon bulb having a first terminal is connected to the junction between said third terminals of said first and second switching elements and having a second terminal for selectively conducting current in either of two directions in response to the currents from the third terminals of said first and second switching elements,
f. a MOS field-effect transistor whose gate is connected through an input resistor to the second terminal of said neon bulb,
g. a non-polarized capacitor inserted between the gate of said MOS field-effect transistor and the ground, and
h. an output resistor inserted between the source of said MOS field-effect transistor and the ground, whereby a variable output voltage may be derived across said output resistor.

8. A remote controlled device for generating variable output voltage as defined in claim 7 wherein
said first and second switching elements comprise two switching transistors.

9. A remote controlled device as defined in claim 7 wherein said first and second switching elements comprise two relays.

10. A circuit for providing a variable control voltage, comprising means providing positive and negative voltages, a first terminal, first and second switching devices connected to apply said positive and negative potentials respectively to said first terminal, said first and second switching devices having control terminals whereby said positive and negative potentials can be selectively applied to said first terminal, an MOS field effect transistor, a neon tube and a resistor serially connected between said first terminal and the gate of said field effect transistor, said positive and negative potentials being greater than the threshold voltage of said neon tube, a non-polarized capacitor connected between the gate of said field effect transistor and ground potential, a source of drain potential connected to the drain electrode of said field effect transistor, and an output resistor connected between the source of said field effect transistor and ground potential.

11. The circuit of claim 10 further comprising a resistor connected between said first terminal and ground potential, and wherein said first and second switching devices comprise first and second switching transistors having their emitter-collector paths connected to apply said positive and negative potentials respectively to said first terminal, and base electrodes connected to their respective control terminals.

12. The circuit of claim 10 wherein said first and second switching devices comprise first and second relays having contacts connected to apply said positive and negative potentials respectively to said first terminal, and energizing coils connected to their respective control terminals.

* * * * *

UNITED STATES PATENT OFFICE
CERTIFICATE OF CORRECTION

Patent No. 4,032,838     Dated June 28, 1977

Inventor(s) Shunji Minami et al.

It is certified that error appears in the above-identified patent and that said Letters Patent are hereby corrected as shown below:

In the Title Page, under "Foreign Application Priority Data";
    "Dec. 30, 1972    Japan..................47-128493"
                        should read -- Dec. 20, 1972    Japan.................47-128439 --.

Signed and Sealed this

Sixth Day of December 1977

[SEAL]

Attest:

RUTH C. MASON  
*Attesting Officer*

LUTRELLE F. PARKER  
*Acting Commissioner of Patents and Trademarks*